US009449129B2

(12) United States Patent
Gullapalli et al.

(10) Patent No.: US 9,449,129 B2
(45) Date of Patent: Sep. 20, 2016

(54) METHOD AND APPARATUS FOR ACCELERATING SPARSE MATRIX OPERATIONS IN FULL ACCURACY CIRCUIT SIMULATION

(71) Applicant: Freescale Semiconductor, Inc., Austin, TX (US)

(72) Inventors: Kiran Kumar Gullapalli, Austin, TX (US); Steven D. Hamm, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 682 days.

(21) Appl. No.: 13/873,621

(22) Filed: Apr. 30, 2013

(65) Prior Publication Data

US 2014/0324398 A1    Oct. 30, 2014

(51) Int. Cl.
*G06F 7/60*     (2006.01)
*G06F 17/50*    (2006.01)

(52) U.S. Cl.
CPC ....... *G06F 17/5036* (2013.01); *G06F 17/5022* (2013.01)

(58) Field of Classification Search
CPC .............. G06F 17/5036; G06F 17/5022
USPC .............................................. 703/2
See application file for complete search history.

(56) References Cited

U.S. PATENT DOCUMENTS

| | | | | |
|---|---|---|---|---|
| 6,182,270 B1 * | 1/2001 | Feldmann | ............... | G06F 17/12 703/14 |
| 6,311,146 B1 * | 10/2001 | Hao | ................... | G06F 17/5036 703/14 |
| 6,577,992 B1 | 6/2003 | Tcherniaev et al. | | |
| 7,555,733 B1 * | 6/2009 | Gee | ...................... | G06F 17/5036 716/106 |
| 7,747,972 B2 * | 6/2010 | Mirbeth | .............. | G06F 17/5031 716/113 |
| 7,996,193 B2 * | 8/2011 | Ye | ........................ | G06F 17/5036 703/2 |
| 8,069,024 B1 * | 11/2011 | Croix | .................. | G06F 17/5022 703/14 |
| 8,260,600 B1 * | 9/2012 | Deng | .................. | G06F 17/5036 703/14 |
| 8,428,928 B1 * | 4/2013 | McGaughy | ......... | G06F 17/5036 703/14 |
| 8,832,635 B2 * | 9/2014 | Lin | ..................... | G06F 17/5009 716/106 |
| 2004/0148324 A1 * | 7/2004 | Garg | ...................... | G06F 17/12 708/446 |

(Continued)

OTHER PUBLICATIONS

Buttari et al.("Using Mixed Precision for Sparse Matrix Computations to Enhance the Performance while Achieving 64-bit Accuracy", The University of Manchester, 2007, pp. 1-28).*

(Continued)

*Primary Examiner* — Omar Fernandez Rivas
*Assistant Examiner* — Iftekhar Khan

(57) ABSTRACT

A system and method of accelerating sparse matrix operations in full accuracy simulation of a circuit includes determining repetitive blocks of the circuit, determining a set of values of a current block, determining whether the state of the current block is sufficiently close to the state of a stored block solution when the corresponding values are within a predetermined error range, and performing a reduced computation using the stored block solution to provide a solution for the current block when the states are sufficiently close to each other. The reduced computation includes retrieving previously stored solutions and performing substantially simplified matrix and vector operations while maintaining accuracy of the solution. Reduced precision versions of the values may be used to generate a hash index used to store the block solutions. Stored redundant device information may also be used to simplify device solutions in a similar manner.

11 Claims, 9 Drawing Sheets

(56) References Cited

U.S. PATENT DOCUMENTS

| | | | | |
|---|---|---|---|---|
| 2009/0030665 A1* | 1/2009 | Kerns | ................ | G06F 17/5036 703/14 |
| 2010/0211922 A1* | 8/2010 | Sinha | ................ | G06F 17/5031 716/108 |
| 2010/0218037 A1* | 8/2010 | Swartz | ................ | G06F 17/30 714/6.12 |
| 2011/0029299 A1* | 2/2011 | Zhu | ................ | G06F 17/5022 703/14 |
| 2011/0307850 A1* | 12/2011 | Dartu | ................ | G06F 17/5031 716/108 |
| 2013/0246015 A1* | 9/2013 | Dong | ................ | G06F 17/5036 703/2 |

OTHER PUBLICATIONS

Qian et al.("A Parallel Sparse Linear System Solver for Large-scale Circuit Simulation based on Schur Complement", IEEE, 2013, pp. 1-4).*

Wang et al.("Parallel Multilevel Sparse Approximate Inverse Preconditioners in Large Sparse Matrix Computations", IEEE, 2003, pp. 1-8).*

* cited by examiner

US 9,449,129 B2

METHOD AND APPARATUS FOR ACCELERATING SPARSE MATRIX OPERATIONS IN FULL ACCURACY CIRCUIT SIMULATION

BACKGROUND OF THE INVENTION

1. Field of the Invention

This disclosure relates generally to computer-aided simulation of large circuits using a hierarchical data structure, and more specifically, to removing redundant calculations in sparse matrix operations in circuit simulation by utilizing previously computed values corresponding to structurally identical blocks within the circuit when it is determined that the blocks share substantially the same state within a predetermined error range.

2. Description of the Related Art

Computer-aided circuit simulation uses mathematical models to replicate the behavior of an electronic circuit. Simulating circuit behavior can improve design efficiency by making faulty designs known and providing insight into the behavior of the circuit before the circuit is actually fabricated. Typical circuit simulators can include both analog and event-driven digital simulation capabilities. An entire mixed signal analysis can be driven from one integrated schematic.

Circuit simulation of complex circuit systems (e.g., systems on a chip) may involve a substantial number of transistors and other devices. In general, there are two types of computer-aided circuit simulation systems, including "flat solvers" and "hierarchical solvers." A flat solver performs simulation at the device level (such as down to the individual transistors, resistors, capacitors, etc.). A netlist describing a large complex circuit system, however, can be very hierarchical in nature with many repeated sub-blocks, such as memory arrays, input/output (I/O) banks, digital logic (e.g., OR gates, AND gates, inverters, etc.), and the like. Hierarchical solvers were developed to exploit latency independently for each cell or block in the hierarchy. However, since flat solvers have significantly evolved, conventional hierarchical solutions exploiting only circuit latency has heretofore not provided a significant advantage in the context of high accuracy circuit simulation. For example, matrix ordering naturally arranges the matrix into block bordered diagonal form and allows flat solvers to exploit data locality. Flat solvers are also able to exploit latency. Hierarchical solvers are not always more efficient. Arranging the matrix computations hierarchically may, in fact, increase the overall operation count which may cause an undesired increase in simulation time.

Conventional hierarchical approaches have not provided significant acceleration of circuit simulation as compared to flat solver approaches. Furthermore, certain hierarchical approaches ignore differences in node voltages between similar block types resulting in undesired loss of accuracy. It is therefore desirable to speed up hierarchical or block level simulation of integrated circuit systems without suffering any loss in accuracy.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present inventors have recognized that there are many redundant calculations in sparse matrix operations in circuit simulation that may be eliminated or the calculations otherwise simplified. Removing the redundant calculations speeds up stamping (or copying) a system of equations and factorizing the sparse matrix, and thus reduces the solution time of solving the equations of the sparse matrix. As these steps can be the dominant cost in high accuracy simulation of large circuits, removing redundant calculations provides a substantial increase in efficiency and reduction in overall simulation time.

Conventional hierarchical solutions either provided minimum computation reduction or otherwise provided inaccurate results. One conventional hierarchical solution attempted to exploit redundancy by requiring the same exact state for identical sub-blocks or cells. This solution provided little improvement since very few blocks have the same identical state during simulation. Another conventional hierarchical solution recognized small changes between similar cell structures, but forced the same solution for each resulting in inaccurate simulation results.

In contrast, a system and method as described herein accelerates circuit simulation by efficiently removing redundant calculations in matrix operations (such as stamping, factoring, and solving) in full accurate simulation. Structurally identical blocks are identified or otherwise determined prior to circuit simulation. During simulation, the state of each block is identified based on the node voltage and/or the branch current levels. For each time step during simulation, a full computation is performed for the first of a given block type encountered and the computations are stored. For each subsequent block encountered during simulation, the block type and state of the block are determined and the stored computations are searched to determine whether stored computations exist for the same block type that is close to the same state. The relative closeness of the state is determined based on a predetermined error range of each of the node voltages or branch currents. If the new block does not have a close state, then a full computation is performed and stored. When a block is identified having a state that is close to the state of stored computations of a block of the same type, the stored computations may be used to substantially reduce redundant calculations. The full matrix is stored in a special hierarchical structure to enable separation of contributions at the ports of the blocks to the full matrix.

Figure 1:
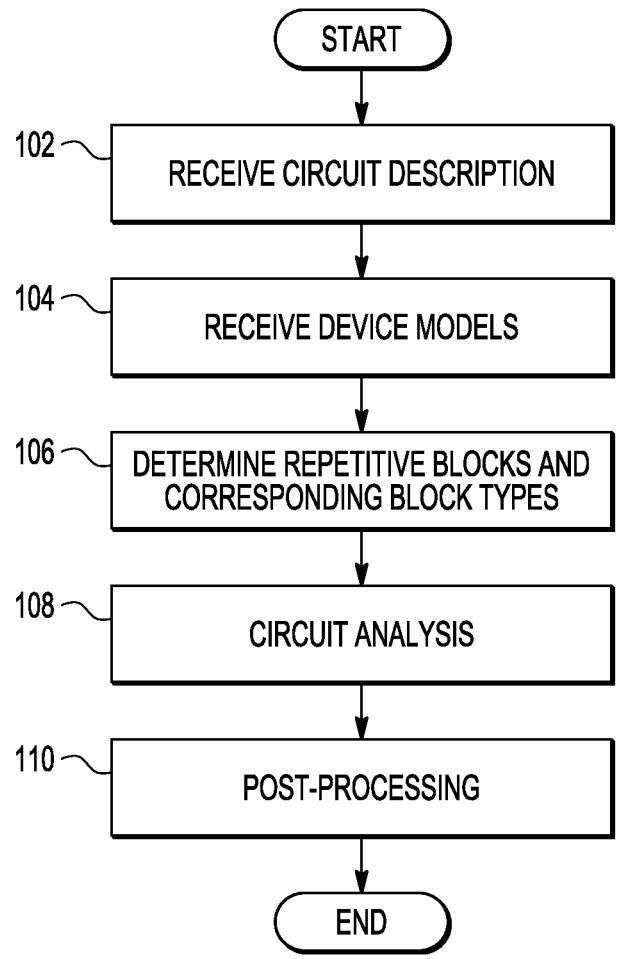
FIG. 1 is a simplified flowchart diagram illustrating operation of a circuit simulator implemented according to one embodiment.

FIG. 1 is a simplified flowchart diagram illustrating operation of a circuit simulator (e.g., 200, FIG. 2) implemented according to one embodiment. A first step in circuit simulation involves receiving a description of the circuit to be simulated (102). One exemplary form of the circuit description is a netlist. A netlist may contain or refer to descriptions of the parts or devices used in the circuit. The netlist may contain definitions of elements or devices used in the circuit and list connections that can be made to that type of device and basic properties of the device. Device instances may encompass a wide variety of parts including, for example, metal-oxide-semiconductor, field-effect transistors (MOSFETs), metal semiconductor FETs (MESFETs), bipolar junction transistors (BJTs), junction gate FETs (JFETs), resistors, capacitors, inductors, integrated circuits, and the like. The circuit description also includes how the various parts of the circuit to be simulated are connected to one another.

In addition to providing a description of the circuit and the various parts of that circuit, a typical step in simulation is the provision of models for devices used in the circuit (104). Certain devices found in a circuit may have complicated behavior that is a function not only of inputs to the device, but also a function of how the device was assembled, operating conditions of the device (e.g., temperature), and the like. In order to ensure reliable simulation of devices exhibiting complicated behavior (e.g., transistors), scientific modeling of physical phenomena observed in their operation is performed. Typical models are based upon device physics (physical models) and curve fitting (empirical models) and provide mathematical descriptions of the nonlinear behavior of devices, such as various types of transistors. In addition, different device models may be used for the varieties of types of transistors. The models may further include parasitic elements and the like, such as inherent resistances and capacitances of circuit elements and traces and the like.

In addition to describing and modeling the circuit at the device level, repeated circuit blocks in the hierarchical structure are determined and corresponding block types are identified (106). Repetitive blocks are those that have identical structures or structural models regardless of their corresponding states. Block types distinguish each set of repetitive block structures from other repetitive block structures. For example, a first block type may identify a memory structure whereas a second block type may identify a logic block structure, and so on. It has been determined that large scale circuits are hierarchical by design. Many such repeated blocks are often in substantially the same state from time point to time point across the circuit, so that there usually exists significant redundancy in the sparse matrix operations (e.g., stamping, factoring, solving) for the full-chip simulation.

As an example, memory cells along a common bit line or word line in a memory array may be driven to the same logic state. If two different but identical memory cells have the same node voltages and/or branch currents, then the solution for the first may be used for the second without further computation. Identical structure with the same stimulation, however, is very rare and may not provide significant acceleration of circuit simulation.

Although the memory cells are identical and have the same logic state, various circuit parameters and factors cause variations in the node voltages (port and internal nodes) or branch currents of the different memory cells so that they do not have the same electrical state. For example, memory cells distributed along a common bit line or word line may be exposed to different parasitic elements or factors causing node voltage or branch current variations. Nonetheless, when each of the node voltages or branch currents are within a predetermined error range, then a substantial portion of the computations performed during the solution for the first memory cell may be reused for the second memory cell. This significantly reduces the computations as further described herein.

Once a description of the circuit and device models are received and repetitive blocks are identified and grouped, analysis of the behavior of the circuit may be performed (108). Such analysis may involve provision of initial conditions (e.g., initial input values and operating conditions) of the circuit at a particular time along with information related to how input values change over time, if any. Analysis includes translating the listing of the devices and blocks in the circuit, their connections, and the models for the devices and blocks into equations to be solved.

Typically, the general equations produced are nonlinear differential-algebraic equations solved using, for example, implicit integration methods, the Newton-Raphson method, and sparse matrix techniques. Circuit simulation involves evaluating mathematical descriptions of the nonlinear models including device and block evaluations. This stage of circuit simulation is typically the most costly in terms of time and resources. Device and block evaluations (e.g., solving for various values of current, charge, and derivatives of those values at the various device terminals and block nodes in the circuit) can contribute to between 20-90% of total cost of simulation. Embodiments of the present invention reduce the time spent during the block evaluation, especially for very large circuits.

Subsequent to performing circuit analysis, the circuit simulator may perform a variety of post-processing tasks (110). Post-processing tasks may include signal processing of circuit outputs, filtering, waveform analysis, displaying results, and the like. Such tasks are determined by the nature of the application.

Figure 2:
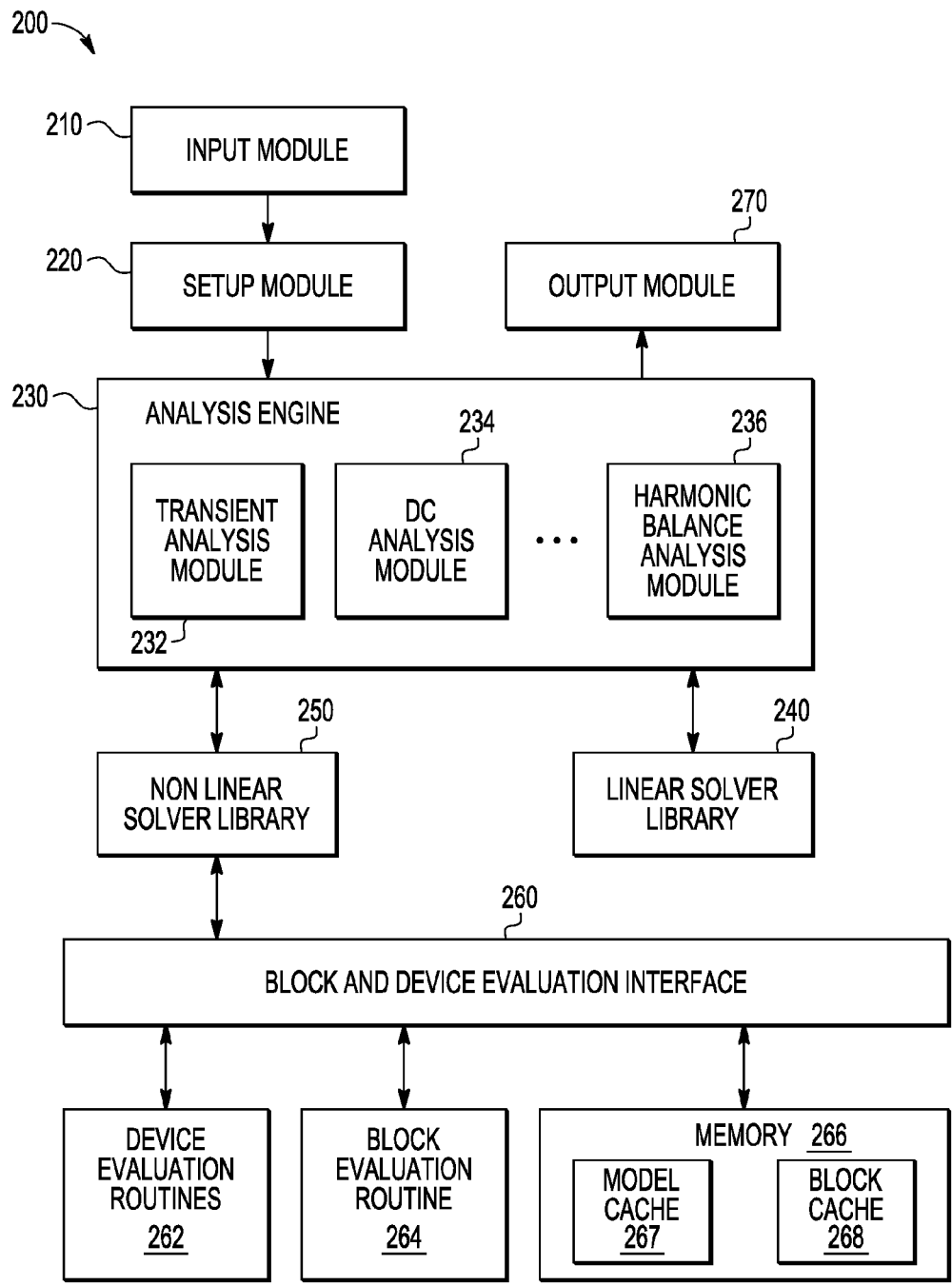
FIG. 2 is a simplified block diagram of a circuit simulation system implemented according to an embodiment of the present invention.

FIG. 2 is a simplified block diagram of a circuit simulation system 200 implemented according to an embodiment of the present invention. The circuit simulation system 200 includes an input module 210. As discussed above with respect to FIG. 1, an initial step in simulation of a circuit is provision of a description of the circuit to be simulated. Input module 210 reads the information provided regarding the devices and blocks in the circuit and identification of models used to represent those devices and blocks. In addition, input module 210 may also provide a mechanism for inputting any requests for types of analysis (e.g., DC or transient) and other types of analysis parameters (e.g., stop time, relative tolerance, absolute tolerance, and the like). Input module 210 may also provide a mechanism for a user to input output requests. Input module 210 may also provide different types of interfaces for receiving the inputs, such as a schematic editor and the like.

Input module 210 passes the inputs received to a setup module 220. The setup module performs a variety of tasks prior to the analysis. For example, setup module 220 may determine the kind of analysis desired, set up arrays to store various values for calculation, process user-specified models, and generate code related to the equations to be solved. The setup module 220 may further perform hierarchical identification and grouping of devices into repetitive blocks and group the repetitive blocks according to type. Each repetitive block "type" identifies those blocks having an identical structure or structural model. For example, a group of identical memory cells may be grouped as block type A, a group of identical digital logic structures (such as OR gates, AND gates, inverters etc.) may be grouped as block type B, and so on.

Analysis of the behavior of the circuit is performed by an analysis engine 230. The analysis engine 230 may include a variety of analysis modules corresponding to the type of analysis requested by the user or required for the application. Examples of analysis modules provided include a transient analysis module 232, DC analysis module 234, and harmonic balance analysis module 236. As previously discussed, circuit simulation may involve solving both linear equations and non-linear equations. Analysis engine 230 accesses libraries that provide functions for solving both linear equations within a linear solver library 240 and non-linear equations within a non-linear solver library 250.

Circuit simulation system 200 provides a set of device evaluation routines 262 and a block evaluation routine 264 accessible to non-linear solver library 250 through a block and device evaluation interface 260. As types of devices are evaluated in the circuit that correspond to the available device evaluation routines, the block and device evaluation interface 260 invokes an appropriate one of the device evaluation routines 262. Typical device evaluation routines correspond to commonly encountered devices that have associated models, such as diodes or different transistor types (e.g., MOSFET, JFET, BJT, etc.) as previously discussed. The block evaluation routine 264 assists in identifying and simulating repetitive blocks as further described herein.

Circuit simulation system 200 may further include a memory 266 for storing simulation values, and which further includes a model cache 267 for storing device computations and solutions organized by device type, and a block cache 268 for storing block structure computations and solutions organized by block type. The circuit simulation system 200 stores output solution values for each device simulated in the circuit during the circuit analysis process. These output values can include current, charge and derivatives of those values at each node of devices in the circuit (e.g., transistor gate, drain, source, body/bulk, and the like). These output values are stored in the memory 266 and associated with the device for which the values are a solution.

In order to use previously evaluated solution values to calculate solution values for a current device, an efficient method for storing input and output values, matching input values, and looking up output values is utilized. Matching a currently evaluated device with a previously evaluated device may be performed by looking up devices having the same physical and topological characteristics with approximately the same input values. The memory 266 includes a model cache 267 to facilitate such matching which uses a hash of the approximate input values as an index for accessing a corresponding solution. In one embodiment, separate model caches are employed for each different group of devices (e.g., devices having the same physical and topological characteristics). The model cache 267 may be organized as a set of lists, in which each list corresponds to devices of a given device type. During simulation, a full analysis solution is determined for the first device of each type, in which the solution is stored within the corresponding list within the model cache 267. For each device in the circuit, the list corresponding to the device type is accessed using a corresponding hash index to determine whether a solution may be used to reduce computation for the subsequent device. The different entries in each list correspond to a unique set of node voltages and/or branch currents that are outside the error range of other entries in the list. When a subsequent device of the same type (identical device) is encountered during simulation having substantially the same node voltages and/or branch currents within the predetermined error range, the device solution is retrieved from the model cache 267 and used to reduce computations for the subsequent device. If there are no solutions within the error range, then the full solution is performed, a corresponding hash index is generated, and the new solution is entered into the corresponding list within the model cache 267 at a location corresponding to the hash index.

The block cache 268 may be organized by the setup module 220 as a set of lists, in which each list corresponds to blocks of a given block type. During simulation, a full analysis solution is determined for the first block of each type, a corresponding hash index is generated, and the block solution is stored within the corresponding list within the block cache 268 at a location corresponding with the hash index. When a repetitive block is encountered, the list corresponding to the block type is accessed using the hash index to determine whether a solution may be used to reduce computation for the current block. The different entries in each list correspond to a unique set of node voltages and/or branch currents that are outside the error range of other entries in the list. When a current block of the same type (identical structure) is encountered during simulation having substantially the same node or branch values (e.g., node voltages or branch currents) within the predetermined error range, the block solution stored within the block cache 268 is used to reduce computations for the current block. If there are no solutions within the error range, then the full solution is performed and the new solution is entered into the corresponding list within the block cache 268.

Figure 3:
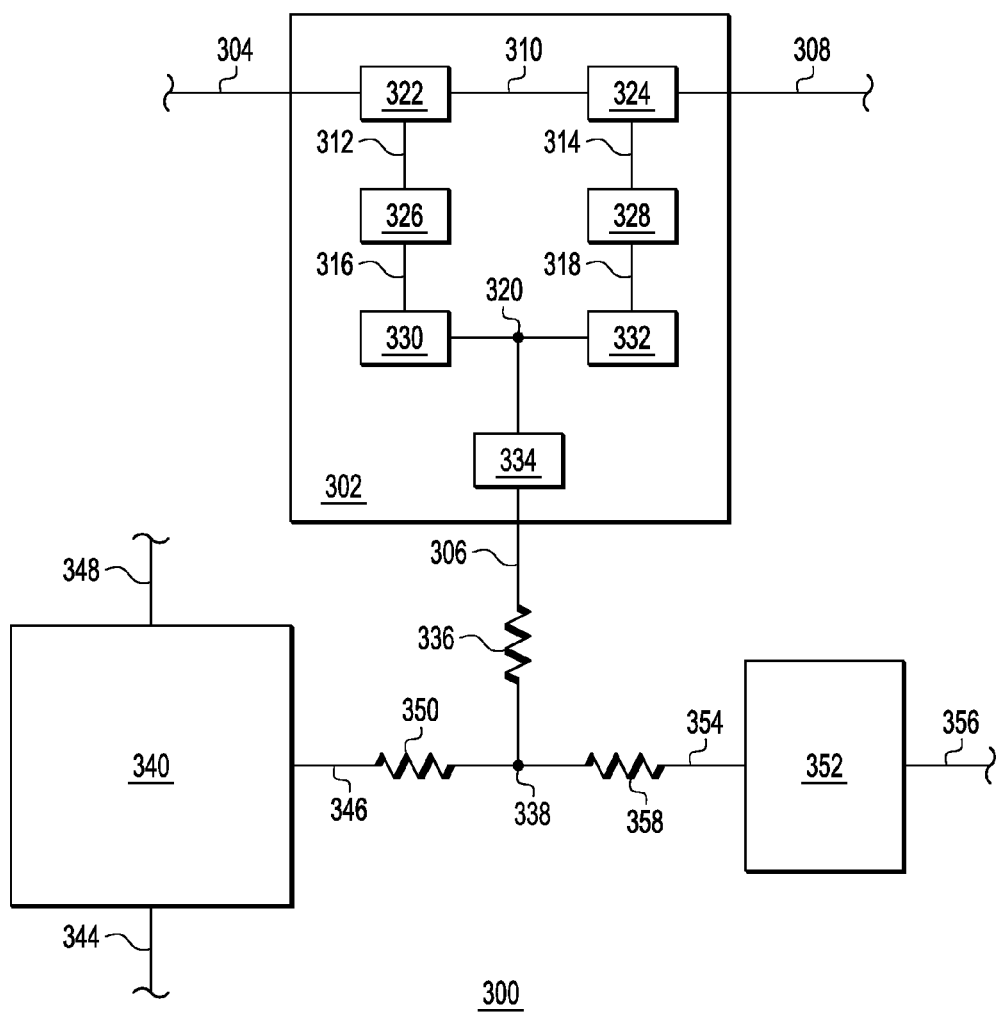
FIG. 3 is a simplified block and schematic diagram of a portion of a circuit to be simulated including repetitive blocks.

Each block includes multiple internal devices such as shown in FIG. 3. If a current block being evaluated is in the same state or a substantially close state as an identical block with a corresponding solution in the block cache 268, then each of the device and component evaluations within the current block may be avoided. In this manner, there is no need to check the individual devices within the block, and there is also no need to linearize the individual devices. Only the port currents and internal currents of the current block are linearized, providing substantial computation savings.

Furthermore, even if the current block is not in the same state or a sufficiently close state such that a full analysis is otherwise performed, any redundant information stored in the model cache 267 may be used for devices in the same or similar state within the subsequent block thereby reducing computations of the full analysis. Consider, for example, that a current block is not sufficiently close to a stored block solution in the block cache 268 since only one or a very small number of the nodes or branches of the current block are outside the predetermined error range of a stored block solution. Although a full analysis computation is performed for the current block, it is likely that many, if not all, of the devices within the current block are sufficiently close to corresponding device solutions within the model cache 267.

In that case, then each of the device and component evaluations within the current block that are sufficiently close to stored solutions in the model cache 267 may be avoided in favor of reduced computations and retrieved information, and there is also no need to linearize those devices. This provides a substantial reduction of computation of the full analysis computation of the current block.

As the circuit analysis is performed, analysis engine 230 may provide output values to output module 270. Output module 270 may provide post processing tasks, such as curve plotting of outputs, interpolation, and providing results to a display device (not shown).

The matrices are set up so that small differences in the states of repeated sub-structures (blocks) do not unnecessarily make their sub-matrices different. Calculations are substantially reduced in matrix factorization and matrix stamping providing increased exploitation of redundancies in model equation evaluation.

FIG. 3 is a simplified block and schematic diagram of a portion of a circuit 300 to be simulated including repetitive blocks. A first block 302 has three external ports 304, 306 and 308 and six internal nodes 310, 312, 314, 316, 318 and 320. The external nodes of a block are referred to herein as ports or port nodes. The first block 302 further includes seven internal devices 322, 324, 326, 328, 330, 332 and 334, in which device 322 is coupled to port 304 and internal nodes 310 and 312, device 324 is coupled to port 308 and internal nodes 310 and 314, device 326 is coupled between internal nodes 312 and 316, device 328 is coupled between internal nodes 314 and 318, device 330 is coupled between internal nodes 316 and 320, device 332 is coupled between internal nodes 318 and 320, and device 334 is coupled between internal node 320 and external port 306. A port of a block is an external node of the block. The two-terminal devices 326, 328, 330, 332 and 334 may represent any one of various types of two-terminal devices, such as resistors, capacitors, inductors, etc., and the three-terminal devices 322 and 324 may represent any one of various three-terminal devices, such as transistors or the like.

The illustrated first block 302 is shown with a very simplified form for purposes of illustration. It is understood that many repetitive blocks may include a significant number of devices and nodes. Also, each of the individual devices may be more sophisticated with additional terminals. A typical MOS or FET transistor device, for example, may include additional terminals, such as body or bulk connections among other connections. The block 302 is shown with 3 external ports and six internal nodes. In many cases in a large scale circuit, the repetitive blocks have a significantly larger number of internal nodes as compared to its external ports, such as in many cases a ratio (internal nodes:external ports) on the order of 100:1 or 1000:1 or the like. Reduction in computations of the repetitive blocks for accelerating sparse matrix operations as described herein accelerates the overall solution.

As shown, the external port 306 of block 302 is coupled to one end of an external resistor 336, having its other end coupled to a common node 338. Another block 340 is shown having three external ports 344, 346 and 348. External port 346 is coupled to one end of another external resistor 350, having its other end coupled to the common node 338. Another block 352 is shown with two external ports 354 and 356 having its external port 354 coupled to one end of another external resistor 358. The other end of the resistor 358 is coupled to the common node 338. Although not explicitly shown, the external ports 304, 308, 344, 348 and 356 may be coupled to other nodes of the circuit 300.

Although the internal portions of the block 340 are not shown, it has been determined that block 340 has an identical structure as block 302 in which the external ports 304, 306 and 308 of the block 302 correspond with the external ports 344, 346 and 348, respectively, of the block 340. As both blocks 302 and 340 have identical block structures, the are both assigned a block type "A". The block 352 is determined to have a different internal structure and is assigned a different block type "B". Although not shown, additional repetitive blocks of types A and B may be included in the circuit 300.

During simulation analysis, if block 302 is the first block of type A to be examined, then a full accuracy solution is performed for block 302 and stored within the block cache 268. The full accuracy solution exploits any redundant device information stored in the model cache 267. When block 340 is encountered during the simulation, then the corresponding list within the block cache 268 is searched to determine whether a solution may be used to reduce the computations for block 340. Assume, for example, that the corresponding voltages or currents of block 340 are each within the predetermined error range of the voltages or currents of the stored solution for the block 302. In that case, the stored solution may be used to reduce computations for block 340 as further described herein. Also, the internal device evaluations within block 340 may be skipped. If block 340 is not in the same state as block 302, then any redundant information stored in the model cache 267 may be used for devices in the same or similar state within the block 340 thereby reducing computations of the full analysis of that block.

It is noted that the "state" of many blocks may generally determined as node voltages determined by Kirchhoff's Current Law (KCL). In some cases the solution may also include branch currents determined by Kirchhoff's Voltage Law (KVL). Thus the solution for the blocks of a given circuit may include a combination of node voltages and/or branch currents. Other quantities may be included in the solution, such as charge values or conductance values or the like.

Figure 4:
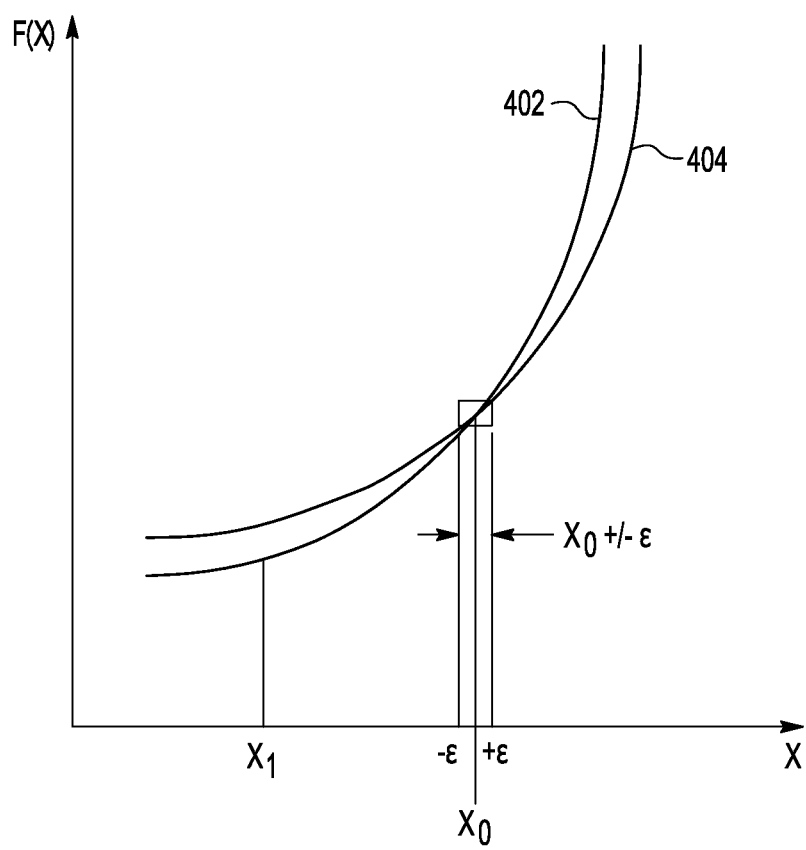
FIG. 4 is a graphic diagram illustrating relative state relationships and a predetermined error range for a corresponding node or branch value between two identical block structures.

FIG. 4 is a graphic diagram illustrating relative state relationships and a predetermined error range for a corresponding node or branch value between two identical block structures. A node value may be a node voltage, such as the voltage of port 306 of block 302 and the voltage of port 346 of block 340. A branch value may be a branch current of the block. A function F(X) is plotted versus the variable X. In one embodiment, for example, a first trace 402 represents the dynamic non-linear variation of the voltage of node 306 of the block 302 and a second trace 404 represents dynamic non-linear variation of the voltage of node 354 of the block 340. Although only one parameter is shown for a single node, it is understood that the analysis is repeated between each pair of corresponding ports and nodes between the repetitive blocks. Also, the parameter X may represent a current through a conductive branch of the block. The traces 402 and 404 intersect at a common point when $X=X_0$, but otherwise diverge as X deviates from $X_0$. Thus, although the blocks 302 and 340 are structurally identical, their respective dynamic operations deviate during circuit operation based on differences between circuit parameters and characteristics.

An error range $X_0 +/- \epsilon$ is drawn centered at $X_0$ illustrating the variations between plots 402 and 404 within the error range. The error value "δ" is determined as an acceptable error that is sufficiently small so that the state difference between the two blocks is sufficiently close within "double precision" or machine precision at $X=X_0$. In other words, $\epsilon$ is chosen to determine an acceptable error range between the states of the two blocks. As illustrated, the differences between plots 402 and 404 within the $\epsilon$ error range are sufficiently small so that the respective states of the corresponding nodes or branches between the two repetitive blocks are within a double precision error metric and thus are said to be sufficiently close in state. In this manner, if each of the nodes or branches of block 340 are within the $\epsilon$ error range of a solution for block 302 at $X_0$, then the computations for block 302 stored within the block cache 268 may be used to simplify the computations for block 340 as further described herein.

It is noted that the solution for block 302 may not be used for the block 340 when the solutions are not sufficiently close. For example, if the solution for block 302 is evaluated at $X=X_1$ for a given time step during simulation, then the states of the two blocks 302 and 340 are not sufficiently close so that a full solution would be computed for block 340 in that case.

It has been determined that if a machine accurate value (e.g., a double precision value) for each of the parameters of a block is rounded to a single precision value for matching purposes, then double precision output values within acceptable accuracy can be calculated for subsequent blocks with identical structure. By using single precision node or branch values for finding matches of subsequent blocks, the likelihood increases of finding a match with a previously calculated block. It is further noted that storage of the computations of the original block as well as a scheme used for searching for matching values should be performed efficiently, such as using a hashing function or the like.

Figure 5:
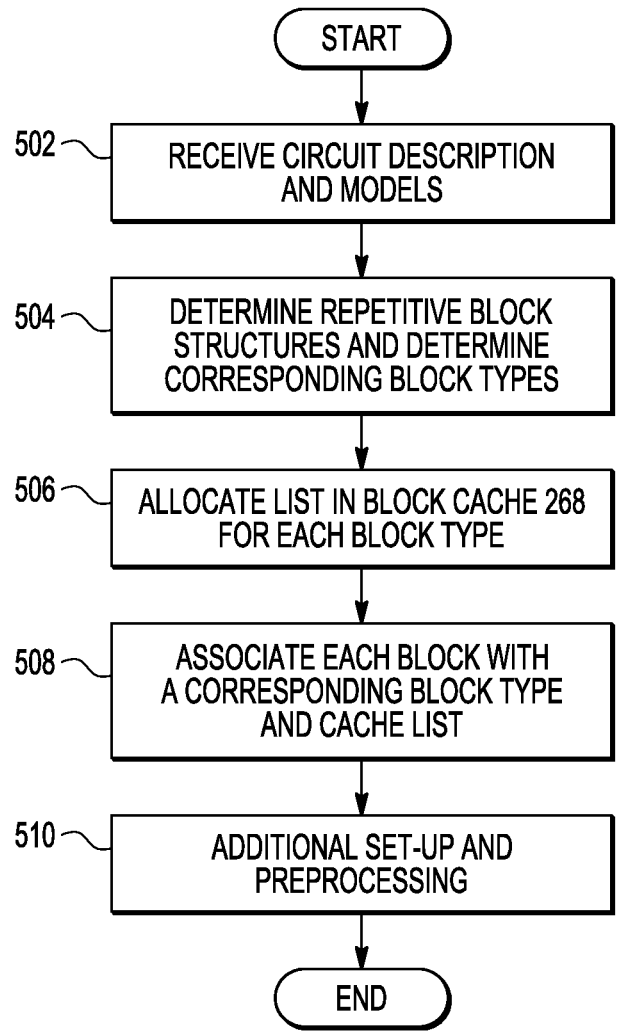
FIG. 5 is a simplified flowchart diagram illustrating steps performed prior to circuit simulation according to at least one embodiment.

FIG. 5 is a simplified flowchart diagram illustrating steps performed prior to circuit simulation according to at least one embodiment of the present invention. An initial step in circuit simulation is to receive the circuit description and device models (502) including models for linear and non-linear devices as well as other circuit parameters and characteristics. The process includes determining repetitive block structures and determining corresponding block types (504). After the block structures are determined and block types defined, a list is allocated within the block cache 268 for each block type (506). Then each determined repetitive block of the circuit is associated with a given block type (508) and the corresponding list within the block cache 268. Additional setup and preprocessing may be performed prior to circuit analysis (510). In this manner, each block is assigned a block type or otherwise grouped according to block type. Each repetitive block of a given block type has an identical block structure as the other blocks of the same block type regardless of how connected to other blocks or external devices in the overall circuit.

It is noted that many (if not most) of the devices and elements of a typical circuit are grouped within repetitive blocks. The devices and elements that are contained within the repetitive blocks are processed as part of the blocks as further described herein.

It is further understood that many devices and elements may fall outside of the confines of the repetitive blocks, such as the resistors 336, 350 and 358 shown in FIG. 3. The equations of those devices and elements that are outside of the repetitive block structures are incorporated into the top matrix and may be processed in any suitable manner. The present disclosure primarily concerns reduction of computations performed to determine solutions for the repetitive blocks, which solutions are then "stamped" or copied into the top matrix for final computations during each simulation time step. Device redundancies within the blocks are also exploited.

A hierarchical simulation according to one embodiment attempts to solve a non-linear equation in several variables according to the following equation (1):

$$F(X)=0 \qquad (1)$$

that represents any one of Kirchhoff's circuit laws, such as the KCL which states that the sum of all of the currents of every node in an electrical circuit is 0, or KVL which generally states that the sum of voltages of a circuit loop is 0. Device equations are used to calculate voltages or currents, which contribute to the node voltage or current summations of the devices. Each element or device in the circuit is represented by an equation, and one or more of the equations are combined for each circuit node or branch and inserted or otherwise "stamped" into a top-level matrix representing the entire circuit (or any selected portion thereof). A solution may be obtained using the Newton-Raphson iteration method starting with an initial guess or approximation $X_0$ and performing one iteration of a transient simulation to obtain a more accurate approximation $X_1$, in which the process is repeated until an accurate solution is obtained as illustrated by the following equation (2):

$$X_{n+1}=X-J_n^{-1} \cdot F(X_n) \qquad (2)$$

in which "n" is an index which denotes each iteration and "J" represents the Jacobian matrix of F(X) or the derivative F'(X) as understood by those of ordinary skill in the art. The iterates converge quadratically assuming a sufficiently accurate initial approximation, which is usually the case using computer simulation techniques. Typically, five or less iterations are needed for each time step (although more or less iterations may be used for a given time step). Then the process is repeated for multiple time steps to simulate the circuit over time. Small errors in the $J_n$ matrix are acceptable as long as the iteration converges rapidly, and errors in the $J_n$ matrix do not impact the accuracy of the final solution as iteration is usually carried out until $X_{n+1}$ satisfies specified error tolerances, which combine a relative and absolute error tolerance.

A flat solver performs simulation at the device level (such as down to the individual transistors, resistors, capacitors, etc.) in which the equations for each of the elements and devices are combined and placed into a single large matrix referred to as the top matrix. A hierarchical solver as described herein uses multiple matrix levels including a top level matrix and at least one sub-level matrix. Repetitive blocks are identified and solutions obtained at a lower level and the equations associated with the nodes or branches of the repetitive blocks are stamped into the top matrix. As described herein, certain block solutions are used for repetitive blocks to substantially simplify the solution for a significant number of the repetitive blocks thereby accelerating the entire circuit simulation.

Consider two blocks A and B in corresponding states XA and XB. If XA=XB, then the solution obtained for block A may be applied directly to block B thereby eliminating additional computations for block B. Exact matches between repetitive blocks, however, is relatively rare. If XB=XA+$\epsilon$, then for a sufficiently small error value $\epsilon$, the solution for block B may be solved according to the following equation (3):

$$FLIN(XB)=F(XA)+\epsilon \cdot J(XA) \qquad (3)$$

in which "FLIN" represents a linearization function performed for F(XB). The error value $\epsilon$ is chosen to be small enough so that the linearization of the function F is about equal to the function F itself within double precision amount of error, or FLIN≈F. This leads to JLIN(XB)=J(XA), so that the same J matrix used for block A may be used for block B, thereby substantially reducing computation. This approach also avoids the full computation of F(XB), in which the linear expansion of equation (3) is used instead. In this manner, there is no need to revisit the computations associated with the interior devices of block B.

Each block includes the following states: QINT[0], . . . , QINT[Ni−1] for charges on Ni internal nodes; QPORT[0], . . . , QPORT[Np−1] for charges on Np port (external) nodes; and V[0] . . . , V[Ni+Np−1] for the node voltages. The J matrix of each block is according to the following equation (4):

$$\begin{bmatrix} J_{ii} & J_{ip} \\ J_{pi} & J_{pp} \end{bmatrix} \begin{bmatrix} \Delta X_i \\ \Delta X_p \end{bmatrix} = \begin{bmatrix} G_{ii} + \alpha C_{ii} & G_{ip} + \alpha C_{ip} \\ G_{pi} + \alpha C_{pi} & G_{pp} + \alpha C_{pp} \end{bmatrix} \begin{bmatrix} \Delta X_i \\ \Delta X_p \end{bmatrix} = \begin{bmatrix} F_i \\ F_p \end{bmatrix} \quad (4)$$

where the subscript "i" denotes internal nodes, the subscript "p" denotes external ports, "the subscript "ii" describes how the internal nodes are connected to each other, the subscript "ip" describes how the internal nodes are connected to the external ports, the subscript "pi" describes how the external ports are connected to the internal nodes, the subscript "pp" describes direct connections between the external ports, "G" denotes conductance, "C" denotes capacitance, the value "a" denotes a coefficient of integration, "ΔX" generally denotes the voltage differences between iterative approximations of respective nodes, and "F" is the function representing node current.

Figure 6:
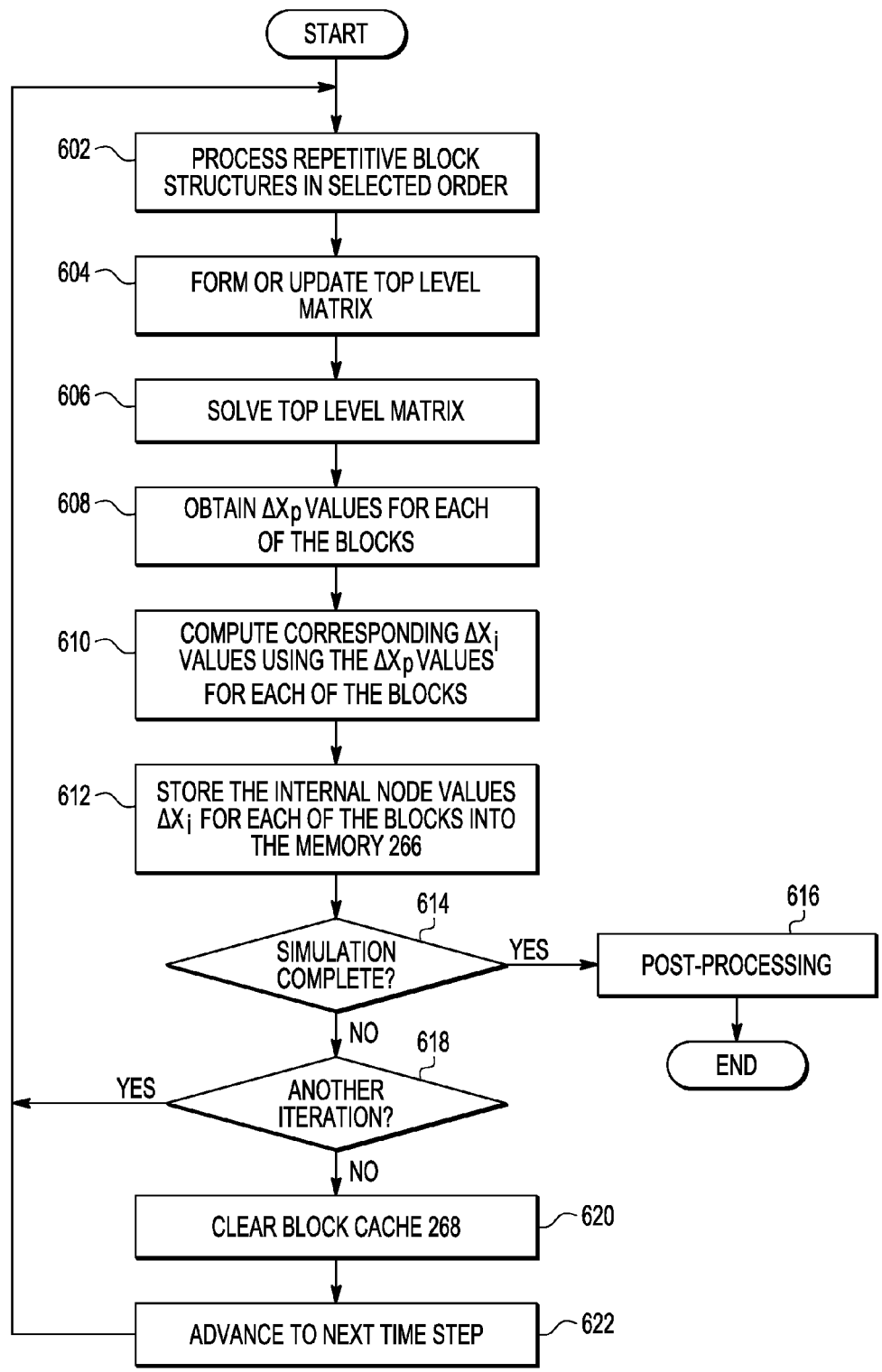
FIG. 6 is a simplified flowchart diagram illustrating operation of a circuit simulator that performs full accuracy circuit simulation and which incorporates accelerated sparse matrix operations according to an embodiment of the present invention.

FIG. 6 is a simplified flowchart diagram illustrating operation of a circuit simulator that performs full accuracy circuit simulation and which incorporates accelerated sparse matrix operations according to an embodiment of the present invention. The repetitive blocks are processed in a selected order (602) as further described herein to generate solutions and corresponding equations which are then inserted into the top level matrix and selectively stored within the block cache 268. The top level matrix is then formed or otherwise updated (604) for the next time step or for the next iteration of the current time step. As previously described, one or more iterations are performed for each of multiple time steps to perform the simulation over time. The top matrix includes equations of devices and elements that are outside of the repetitive block structures and sufficient space is provided for the equations of the repetitive blocks.

Once the top level matrix is formed or updated, it is solved (606) for the current iteration. The solution results in a determination of the $\Delta X_p$ values representing the voltage and/or current estimate differences associated with the external nodes of each of the blocks (608) between consecutive iterations. The corresponding $\Delta X_i$ values corresponding to the voltage and/or current estimate differences associated with the internal nodes of each of the blocks is then computed for each block (610) and the internal node results are stored in the memory 266 (612). When the overall simulation is complete (614), post-processing tasks (616) may be performed, such as signal processing of circuit outputs, filtering, waveform analysis, displaying results, and the like and operation is completed. If the simulation is not complete, it is queried whether another iteration is to be performed for the current time step (618), such as when the solution has not sufficiently converged. For another iteration, operation returns to process the repetitive block structures (602) for the next iteration of the current time step.

When the iterations are completed for the current time step and another time step is to be processed, the block cache 268 is cleared (620), operation advances to the next time step (622), and operation returns to update the top level matrix (602) for the next time step. In an alternative embodiment, the block cache 268 is not cleared but instead the solutions may be carried over to the next time step. It has been determined, however, that clearing the block cache 268 and starting anew for the next time step results in faster and more efficient processing.

Figure 7:
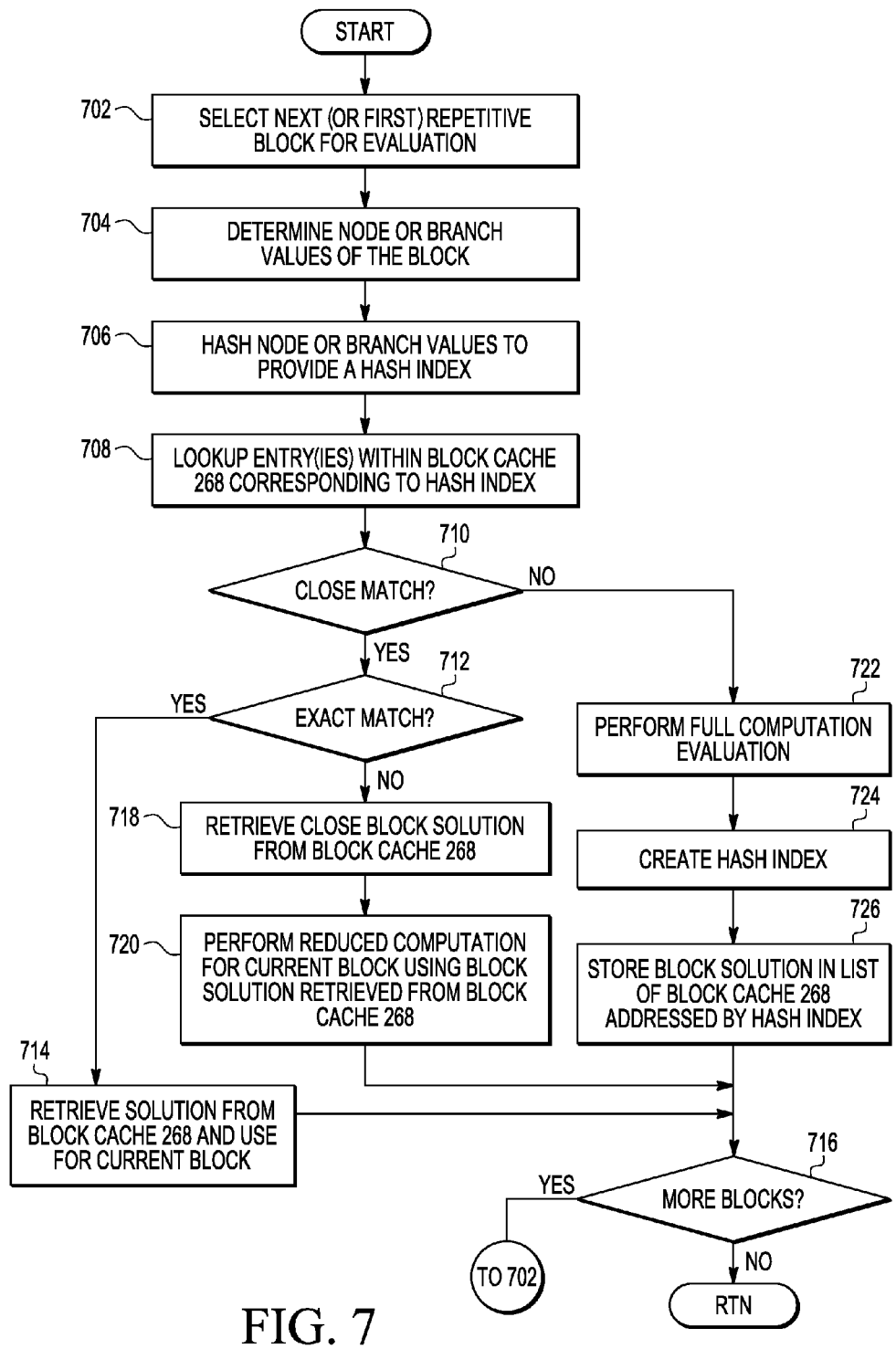
FIG. 7 is a more detailed flowchart diagram illustrating operation associated with processing the computations of the repetitive blocks of the circuit being simulated.

FIG. 7 is a more detailed flowchart diagram illustrating operation associated with processing the computations of the repetitive blocks (602). The next (or first) repetitive block is selected for evaluation (702). Values of the nodes (block nodes including external ports and internal nodes) or branches of the block are determined (704), and the set of values are hashed to provide a hash index (706). Any appropriate hashing algorithm may be used to generate the hash index, and hashing is not further described. A hashing algorithm may be employed to more efficiently search for a match or sufficiently close solution within the list of solutions for each block type.

In one embodiment, the node or branch values are stored as higher precision values, such as double-precision or the like. The node or branch values may be stored as a vector (higher precision vector) or the like which incorporates the higher precision values. In order to generate the hash index, however, the node or branch values are first approximated using reduced precision values that are applied to a hash algorithm to generate the hash index. The reduced precision is less than the higher precision level, such as single precision or any other suitable reduced precision level depending upon the particular implementation. Furthermore, the reduced precision values may also be stored as another vector (reduced precision vector) used for search purposes. The hash index is a simplified binary or digital value used as an address value or the like to access the block solutions stored within the block cache 268. In this manner, multiple identical block structures may hash to the same exact hash index but have states which deviate by an amount that is greater than the predetermined error range. In the event that multiple blocks having corresponding states that are not sufficiently close have identical hash indexes, the block solutions stored within the block cache 268 are linked together or otherwise associated with each other within the corresponding list of the given block type.

The hash index is then applied to the list within the block cache 268 corresponding to the same block type as the next block being evaluated to access the corresponding entry (or entries) within the list (708). As previously noted, multiple blocks may have the same hash index resulting in multiple entries. Also, each entry includes a reduced precision vector incorporating the reduced precision port values for the solution and a higher precision vector incorporating the higher precision port values for the solution. In one embodiment, the reduced precision vector for the current block is first compared with the reduced precision vector of each stored entry corresponding with the hash index to determine whether there is a close match (710). If there is a match between the reduced precision vectors, then the corresponding higher precision vectors are compared to determine whether there is an exact match (712). If an exact match at full-precision is found, then the solution is retrieved from the block cache (714) and used to update the current block of the top matrix in which further computation including internal device evaluation is completely avoided. It is noted that matches at the higher precision are relatively rare but provide the greatest computation reduction when they exist. Operation then advances to determine whether there are any additional blocks to evaluate (716). If not, then operation returns to update the top level matrix (604). Otherwise, operation returns to select the next repetitive block for evaluation (702).

When an exact match is not found but a close match exists (i.e., each of the node or branch values for the corresponding entries are within the predetermined error range (+/−ϵ)), then the corresponding solution is retrieved from the block cache (718) and used to perform a reduced computation evaluation (720) of the current block as further described herein. In general, the stored set of values of the stored block solution are used to evaluate a solution for the current block as further described herein. Operation then advances to determine whether there are any additional blocks to evaluate (716). If not, then operation returns to update the top matrix (604). Otherwise, operation returns to select the next repetitive block for evaluation (702).

If a close match does not exist (710) within the block cache 268, then a full computation evaluation is performed for the block (722) as further described herein. It is noted that the level of computations for the reduced computation at 720 provides substantial computation reduction as compared to the full computation evaluation at 722. Then a corresponding hash index is generated for the entry (724), and the block solution is stored within the block cache 268 at the address location of the generated hash index (726). The stored solution includes the reduced resolution vector and higher resolution vector as previously described. If multiple block solutions have the same hash index, then they are linked together so that the solution for each is compared to a subsequent block having the same hash index. Operation then advances to determine whether there are any additional blocks to evaluate (716). If not, then operation returns to update the top level matrix (604). Otherwise, operation returns to select the next repetitive block for evaluation (702).

Figure 8:
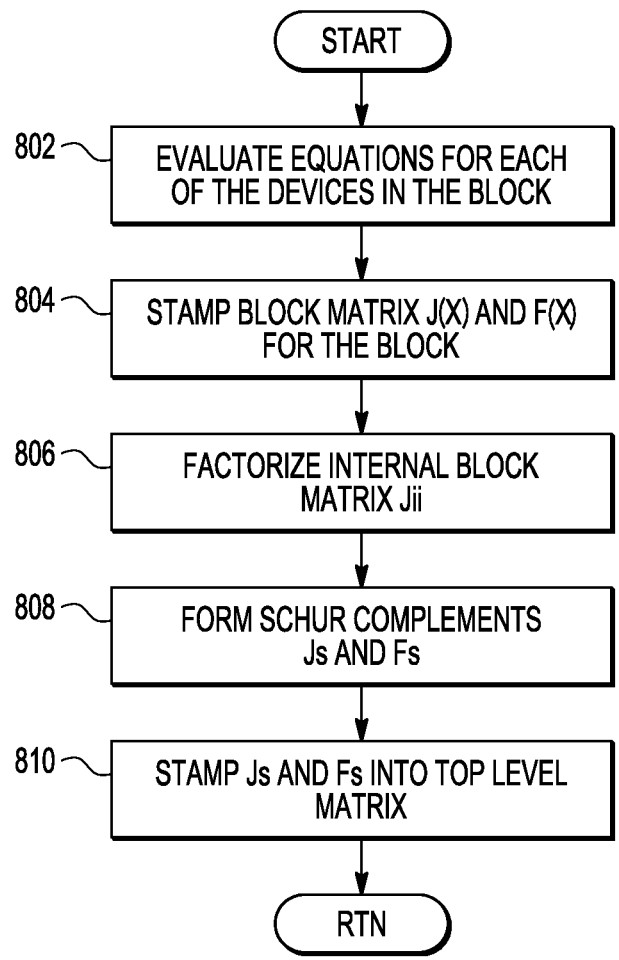
FIG. 8 is a block diagram illustrating full computation evaluation for a block in which a close solution has not been found in the block cache of FIG. 2.

FIG. 8 is a block diagram illustrating full computation evaluation (722) for a block in which a close solution has not been found in the block cache 268. The equations for each of the elements and devices within the block are evaluated (802). Device evaluations are simplified to the extent that redundant information exists in the model cache 267 for identical devices in the same or substantially the same state. The block matrix is stamped (e.g., copied) with the J(X) and F(X) values (804). The internal block matrix $J_{ii}$ is not explicitly inverted but is instead factorized according to the LU decomposition according to the following equation (5):

$$J_{ii} = L_{ii} \cdot U_{ii} \qquad (5)$$

in which $L_{ii}$ is the lower triangular matrix and $U_{ii}$ is the upper triangular according to sparse matrix operation methods understood by those of ordinary skill in the art. Steps 802, 804, and 806 are simplified to the extent that that redundant information exists in the model cache 267 for identical devices in the same or substantially the same state. The Schur complements Js and Fs are then formed (808) according to the respective equations (6) and (7):

$$Js = J_{pp} - J_{pi} J_{ii}^{-1} \cdot J_{ip} \qquad (6)$$

$$Fs = F_p - J_{pi} J_{ii}^{-1} \cdot F_i \qquad (7)$$

in which Js is the admittance and Fs is a current, in which Js and Fs are jointly referred to as the Norton equivalent as understood by those of ordinary skill in the art. The Js and Fs values are then stamped into the top level matrix (810), and operation returns to repetitive block evaluation in which the has index is created (724) and the solution is added to the block cache 268.

The full solution described in FIG. 8 includes very complex and time consuming operations. Evaluation of each of the devices in the block (802), stamping the block matrix with the J(X) and F(X) values (804), factoring $J_{ii}$ (806) and forming the Schur complement for admittance Js (808) are each very computationally-intensive and time-consuming operations. As noted herein, however, these operations may be simplified to the extent that redundant information exists in the model cache 267 for identical devices in the same or substantially the same state.

After the full computation evaluation is generated, the hash index is generated as shown at 724 and the block solution is stored in the block cache 268 addressed by the hash index as shown at 726 as previously described. In one embodiment, the charges, currents and voltages of each of the ports and nodes are stored along with capacitance values and conductance values between each of the nodes and between the ports and nodes of the block. Furthermore, the entire J matrix shown in equation (4), or at least the Schur complement Js along with the $J_{pi}$ and $J_{ii}^{-1}$ values, are stored and used to perform the reduced computation for subsequent blocks which have a sufficiently close state as shown at 720.

Figure 9:
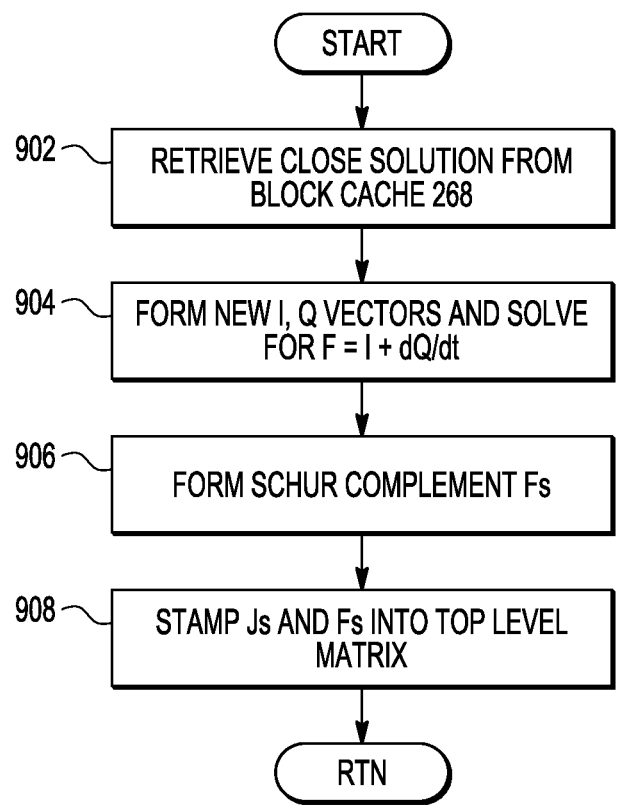
FIG. 9 is a block diagram illustrating simplified computation evaluation for a block in which a close solution has been found in the block cache of FIG. 2.

FIG. 9 is a block diagram illustrating simplified computation evaluation (720) for a block in which a close solution has been found in the block cache 268. The close solution found in the block cache 268 is retrieved (902) so that device equation evaluation (802) and block stamping (804) are avoided. Instead, the block matrix is formed using the simple matrix addition to solve F=I+dQ/dt, in which I and dQ/dt are formed using simple matrix multiplication (904). The derivative of Q, or dQ/dt, may be formed from the present and past values of Q stored in the memory 266. The Q vector identifies the internal node and port charges of the new block, and the I vector identifies the corresponding currents associated with the internal node and port nodes according to the following equations (8) and (9):

$$\begin{bmatrix} Q_{I,B} \\ Q_{P,B} \end{bmatrix} = \begin{bmatrix} Q_{I,A} \\ Q_{P,A} \end{bmatrix} + \begin{bmatrix} C_{ii,A} & C_{ip,A} \\ C_{pi,A} & C_{pp,A} \end{bmatrix} \begin{bmatrix} V_{i,B} - V_{i,A} \\ V_{p,B} - V_{p,A} \end{bmatrix} \qquad (8)$$

$$\begin{bmatrix} I_{I,B} \\ I_{P,B} \end{bmatrix} = \begin{bmatrix} I_{I,A} \\ I_{P,A} \end{bmatrix} + \begin{bmatrix} G_{ii,A} & G_{ip,A} \\ G_{pi,A} & G_{pp,A} \end{bmatrix} \begin{bmatrix} V_{i,B} - V_{i,A} \\ V_{p,B} - V_{p,A} \end{bmatrix} \qquad (9)$$

where $Q_{I,B}$ and $Q_{P,B}$ are the internal node and port node charges, respectively, of the current block "B", $Q_{I,A}$ and $Q_{P,A}$ are the internal node and port node charges, respectively, of the previously stored block "A" determined to be close in state to block B, $I_{I,B}$ and $I_{P,B}$ are the internal node and port node currents, respectively, of the current block B, $I_{I,A}$ and $I_{P,A}$ are the internal node and port node currents, respectively, of the previously stored block A, C and G denote capacitance and conductance, respectively, and "V" denotes the voltage of a corresponding internal node "i" or port node "p" of the indicated block A or B. Thus, $V_{i,B} - V_{i,A}$ denotes the voltage difference between the corresponding internal nodes of the two blocks A and B within the predetermined error range determined by +/−ϵ, and $V_{p,B} - V_{p,A}$ denotes the voltage difference between the corresponding internal nodes of the two blocks A and B within the same predetermined error range.

The Schur complement Js computation according to equation (6) is skipped entirely since retrieved from the close block solution stored in the block cache 268. Nonetheless, the Norton equivalent Fs is formed according to equation (7) (906). The Fs computation is significantly faster and cheaper to compute as compared to Js, and the formation of Fs enables a full accuracy simulation as compared to conventional solutions. Then, the Js and Fs values are then stamped into the top level matrix (908), and operation returns to determine whether there are any additional blocks to evaluate (716) as previously described.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

The foregoing describes embodiments including components contained within other components. Such architectures are merely examples, and, in fact, many other architectures can be implemented which achieve the same functionality. In an abstract but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

The foregoing detailed description has set forth various embodiments of the present invention via the use of block diagrams, flowcharts, and examples. It will be understood by those within the art that each block diagram component, flowchart step, operation and/or component illustrated by the use of examples can be implemented, individually and/or collectively, by a wide range of hardware, software, firmware, or any combination thereof.

The present invention has been described in the context of fully functional simulation systems; however, those skilled in the art will appreciate that the present invention is capable of being distributed as a program product in a variety of forms, and that the present invention applies equally regardless of the particular type of computer-readable media used to actually carry out the distribution. Examples of computer-readable media include non-transitory computer-readable storage media, as well as media storage and distribution systems developed in the future. Non-transitory computer-readable media may include, for example without limitation, any number of the following: magnetic storage media including disk tape media storage, optical storage media such as compact disk media (e.g., CD-ROM, CD-R, CD-RW, etc.) and digital video disk storage media; non-volatile memory storage media including semiconductor-based memory units such as FLASH memory, EEPROM, EPROM, ROM; ferromagnetic digital memory, MRAM; volatile storage media including registers, caches, main memory, RAM, and the like. Other new and various types of non-transitory computer-readable storage media may be used to store the modules disclosed herein. Non-transitory computer-readable storage media include all computer-readable media, except for a transitory, propagating signal.

The above-discussed embodiments may be implemented by software modules that perform one or more tasks associated with the embodiments. The software modules discussed herein may include script, batch, or other executable files. The software modules may be stored on a machine-readable or computer-readable storage media such as magnetic floppy disks, hard disks, semiconductor memory (e.g., RAM, ROM, and flash-type media), optical discs (e.g., CD-ROMs, CD-Rs, and DVDs), or other types of memory modules. A storage device used for storing firmware or hardware modules in accordance with an embodiment of the invention can also include a semiconductor-based memory, which may be permanently, removably or remotely coupled to a microprocessor/memory system. Thus, the modules can be stored within a computer system memory to configure the computer system to perform the functions of the module. Other new and various types of computer-readable storage media may be used to store the modules discussed herein.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein can be made based on the description set forth herein, without departing from the scope of the invention.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Consequently, the invention is intended to be limited only by the scope of the appended claims, giving full cognizance to equivalents in all respects.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of accelerating sparse matrix operations in full accuracy simulation of a circuit, comprising:
   determining repetitive blocks of the circuit and associating each of the repetitive blocks with one of a plurality of block types in which each block type identifies blocks having identical block structures;
   determining a set of node or branch values of a current block of the repetitive blocks of the circuit;
   determining whether the set of node or branch values of the current block is within a predetermined error range of a stored set of node or branch values of a stored block solution previously computed for another block of the same block type, in which the predetermined error range comprises a linear approximation range;
   when the set of node or branch values of the current block is outside the predetermined error range of a stored set of node or branch values of any stored block solution, performing a full computation evaluation for determining a solution for the current block and storing the solution; and
   when the set of node or branch values of the current block is not identical to but is within the predetermined error range of a stored set of node or branch values of a stored block solution of the same block type, performing a reduced computation evaluation using the stored set of node or branch values of the stored block solution to determine a solution for the current block, wherein said reduced computation evaluation comprises:
      determining charge values of the current block based on charge values of the stored block solution, capacitance values of the stored block solution, and voltage differences between the current block and the stored block solution;
      determining charge value changes of the current block;
      determining electrical current values of the current block based on electrical current values of the stored block solution, conductance values of the stored block solution, and voltage differences between the current block and the stored block solution; and
      adding the charge value changes of the current block to the electrical current values of the current block to provide updated electrical current values.

2. The method of claim 1, wherein said determining a set of node or branch values of a current block comprises determining a set of node voltages or branch currents of the current block.

3. The method of claim 1, wherein said determining whether the set of node or branch values of the current block is within a predetermined error range of a stored set of node or branch values of a stored block solution comprises determining whether a plurality of node voltages or branch currents of the current block is within a predetermined error range of corresponding stored voltages or branch currents of the stored block solution.

4. The method of claim 1, wherein said reduced computation evaluation further comprises:
   forming a Schur complement $F_s$ of the current block based on the updated electrical current values and admittance information from the stored block solution.

5. The method of claim 4, wherein said reduced computation evaluation further comprises:
   retrieving a Schur complement $J_s$ from the stored block solution of the same block type;
   copying $F_s$ and $J_s$ into a top level matrix representing the circuit;
   solving the top level matrix and providing a top level matrix solution comprising node voltages or branch currents of the circuit for a given iteration; and
   updating node voltages of the current block using updated node voltages obtained from the top level matrix solution.

6. The method of claim 1, further comprising:
   generating a hash index from the set of node or branch values of the current block;
   applying the hash index to a block cache to determine whether at least one block solution is stored within the block cache corresponding with the hash index; and
   when at least one block solution is stored corresponding with the hash index, said determining whether the set of node or branch values of the current block is within a predetermined error range of a stored set of node or branch values of a stored block solution comprising comparing the set of node or branch values of the current block with a stored set of node or branch values of each stored block solution corresponding to the hash index.

7. The method of claim 6, wherein said generating a hash index comprises generating the hash index using reduced precision values of the set of node or branch values of the current block.

8. The method of claim 1, further comprising:
   when the set of node or branch values of the current block is not within a predetermined error range of a stored set of node or branch values of a stored block solution, then performing a full computation evaluation of the current block and generating a corresponding block solution;
   generating a hash index using the set of node or branch values; and
   storing the block solution in a memory at a location corresponding with the hash index.

9. The method of claim 8, wherein said generating a hash index comprises generating a hash index using a reduced precision version of the set of node or branch values of the current block.

10. The method of claim 8, wherein when a prior block solution is stored in the memory at the same location corresponding with the hash index, further comprising linking the prior block solution and the current block solution together at respective locations corresponding with the hash index.

11. The method of claim 1, wherein said full computation evaluation further comprises:
   determining whether at least one device within the current block has a state which is close to a state of a stored device solution; and
   when the state of at least one device within the current block has a state which is close to a stored device solution, performing a reduced computation for the at least one device using a stored device solution.

* * * * *